United States Patent
Wei et al.

(10) Patent No.: US 11,848,039 B2
(45) Date of Patent: Dec. 19, 2023

(54) CROSS-POINT MRAM INCLUDING SELF-COMPLIANCE SELECTOR

(71) Applicant: Avalanche Technology, Inc., Fremont, CA (US)

(72) Inventors: Zhiqiang Wei, Pleasanton, CA (US); Kimihiro Satoh, Wilsonville, OR (US); Woojin Kim, San Jose, CA (US); Zihui Wang, Mountain View, CA (US)

(73) Assignee: Avalanche Technology, Inc., Fremont, CA (US)

( * ) Notice: Subject to any disclaimer, the term of this patent is extended or adjusted under 35 U.S.C. 154(b) by 439 days.

(21) Appl. No.: 17/227,294

(22) Filed: Apr. 10, 2021

(65) Prior Publication Data

US 2021/0312964 A1 Oct. 7, 2021
US 2022/0383920 A9 Dec. 1, 2022

Related U.S. Application Data

(60) Continuation-in-part of application No. 16/836,922, filed on Apr. 1, 2020, now Pat. No. 11,538,857, (Continued)

(51) Int. Cl.
*G11C 11/16* (2006.01)
*H10B 61/00* (2023.01)
(Continued)

(52) U.S. Cl.
CPC ............ *G11C 11/161* (2013.01); *H10B 61/10* (2023.02); *H10N 50/10* (2023.02); *H10N 50/80* (2023.02); *H10N 50/85* (2023.02)

(58) Field of Classification Search
CPC ...... H10B 61/10; G11C 11/161; H10N 50/80; H10N 50/85; H10N 50/10
See application file for complete search history.

(56) References Cited

U.S. PATENT DOCUMENTS 6,944,052 B2 9/2005 Subramanian et al.
9,767,901 B1 9/2017 Sharma et al.
(Continued)

OTHER PUBLICATIONS

Zhang et al., "Realization of self-compliance resistive switching memory via tailoring interfacial oxygen," ACS Applied Materials and Interface 2019, 11, 41490-41496.
(Continued)

*Primary Examiner* — Jami Valentine Miller
(74) *Attorney, Agent, or Firm* — Bing K. Yen

(57) ABSTRACT

The present invention is directed to a magnetic memory cell including a magnetic tunnel junction (MTJ) memory element and a two-terminal bidirectional selector coupled in series between two conductive lines. The MTJ memory element includes a magnetic free layer; a magnetic reference layer; and an insulating tunnel junction layer interposed therebetween. The two-terminal bidirectional selector includes a bottom electrode; a top electrode; a load-resistance layer interposed between the bottom and top electrodes and comprising a first tantalum oxide; a first volatile switching layer interposed between the bottom and top electrodes and comprising a metal dopant and a second tantalum oxide that has a higher oxygen content than the first tantalum oxide; and a second volatile switching layer in contact with the first volatile switching layer and comprising a third tantalum oxide that has a higher oxygen content than the first tantalum oxide.

20 Claims, 8 Drawing Sheets

Related U.S. Application Data which is a continuation-in-part of application No. 16/793,349, filed on Feb. 18, 2020, now Pat. No. 11,127,787, which is a division of application No. 15/863,825, filed on Jan. 5, 2018, now Pat. No. 10,593,727, which is a continuation-in-part of application No. 15/438,631, filed on Feb. 21, 2017, now Pat. No. 10,559,624, and a continuation-in-part of application No. 15/157,607, filed on May 18, 2016, now Pat. No. 10,224,367.

(51) Int. Cl.
*H10N 50/10* (2023.01)
*H10N 50/80* (2023.01)
*H10N 50/85* (2023.01)

(56) References Cited

U.S. PATENT DOCUMENTS

| | | | |
|---|---|---|---|
| 10,096,362 B1 * | 10/2018 | Nazarian | G11C 13/004 |
| 10,593,727 B2 * | 3/2020 | Yang | G11C 11/161 |
| 10,964,388 B2 * | 3/2021 | Jo | G11C 13/0097 |
| 2007/0159869 A1 | 7/2007 | Baek et al. | |
| 2013/0070511 A1 | 3/2013 | Wells et al. | |
| 2014/0146594 A1 | 5/2014 | Hayakawa et al. | |
| 2014/0157065 A1 | 6/2014 | Ong | |
| 2014/0209892 A1 | 7/2014 | Kuo et al. | |
| 2014/0264224 A1 | 9/2014 | Zhang et al. | |
| 2014/0319634 A1 | 10/2014 | Shukh | |
| 2015/0311252 A1 | 10/2015 | Gan et al. | |
| 2015/0325783 A1 | 11/2015 | Wang et al. | |
| 2016/0020250 A1 | 1/2016 | Li et al. | |
| 2016/0268341 A1 * | 9/2016 | Nazarian | H10N 70/021 |
| 2017/0271406 A1 | 9/2017 | Yang et al. | |
| 2018/0062075 A1 * | 3/2018 | Jo | H10N 70/8833 |
| 2018/0240845 A1 * | 8/2018 | Yang | G11C 11/161 |
| 2019/0172871 A1 | 6/2019 | Yang et al. | |
| 2020/0006650 A1 * | 1/2020 | Wang | H10N 70/8416 |
| 2021/0066584 A1 * | 3/2021 | Jo | H10N 70/801 |

OTHER PUBLICATIONS

Wu et al., "Self-compliance and high performance Pt/HfOx/Ti RRAM achieved through annealing," Nanomaterials 2020, 10, 457.

* cited by examiner

WRITING TO LOW RESISTANCE

WRITING TO HIGH RESISTANCE

CROSS-POINT MRAM INCLUDING SELF-COMPLIANCE SELECTOR

CROSS-REFERENCE TO RELATED APPLICATIONS

The present application is a continuation-in-part of application Ser. No. 16/836,922, filed on Apr. 1, 2020, the content of which is incorporated herein by reference in its entirety, including its specification.

BACKGROUND

The present invention relates to a selector device for memory applications, and more particularly, to embodiments of a two-terminal bidirectional selector device incorporating therein multiple switching layers and a load-resistance layer.

Spin transfer torque magnetic random access memory (STT-MRAM) is a new class of non-volatile memory, which can retain the stored information when powered off. An STT-MRAM array normally comprises an array of magnetic memory cells, each of which includes a magnetic memory element and an access transistor coupled in series between two electrodes. The access transistor functions like a switch to direct current or voltage through the selected magnetic memory element coupled thereto. Upon application of an appropriate switching voltage or current to the selected magnetic memory element, the resistance of the magnetic memory element would change accordingly, thereby switching the stored logic in the respective memory cell FIG. 1 is a schematic circuit diagram of a conventional STT-MRAM array 30, which comprises a plurality of memory cells 32 with each of the memory cells 32 including an access transistor 34 coupled to a magnetic memory element 36; a plurality of parallel word lines 38 with each being coupled to the gates of a respective row of the access transistors 34 in a first direction; and a plurality of parallel bit lines 40 with each being coupled to a respective row of the magnetic memory elements 36 in a second direction substantially perpendicular to the first direction; and a plurality of parallel source lines 42 with each being coupled to a respective row of the access transistors 34 in the second direction.

The magnetic memory element 36 normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). Upon the application of an appropriate current through the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the reference layer. Therefore, the MTJ has two stable resistance states that allow the MTJ to serve as a non-volatile memory element.

Based on the relative orientation between the magnetic reference and free layers and the magnetization directions thereof, an MTJ can be classified into one of two types: in-plane MTJ, the magnetization directions of which lie substantially within planes parallel to the same layers, or perpendicular MTJ, the magnetization directions of which are substantially perpendicular to the layer planes.

FIGS. 2A and 2B illustrate bipolar programming operations of an STT-MRAM cell including a perpendicular MTJ memory element 80 coupled to a selection transistor 82 in series. The MTJ memory element 80 includes a magnetic reference layer 84 having an invariable or fixed magnetization direction 86 perpendicular to the layer plane thereof, a magnetic free layer 88 having a variable magnetization direction 90 or 96 perpendicular to the layer plane thereof, and a tunnel junction layer 92 interposed therebetween.

FIG. 2A illustrates the writing process for switching the resistance state of the MTJ memory element 80 from high to low. As electrons that pass through the magnetic reference layer 84 are being spin-polarized, the spin-polarized electrons exert a spin transfer torque on the magnetic free layer 88. When the spin-polarized current or parallelizing current ($i^P$) 98 exceeds a threshold level, the magnetic free layer 88 switches from the anti-parallel to parallel magnetization direction 90. It should be noted that the parallelizing write current ($i^P$) 98 flows in the opposite direction as the electrons.

Conversely, FIG. 2B illustrates the writing process for switching the resistance state of the MTJ memory element 80 from low to high. As electrons pass through the magnetic free layer 88, the electrons with the same spin direction as that of the magnetization in the magnetic reference layer 84 pass into the magnetic reference layer 84 unimpeded. However, the electrons with the opposite spin direction are reflected back to the magnetic free layer 88 at the boundary between the tunnel junction layer 92 and the magnetic reference layer 84, causing the magnetization direction 96 of the magnetic free layer 88 to switch from the parallel to anti-parallel orientation when the anti-parallelizing current ($i^{ap}$) 100 exceeds a threshold level.

The cell size of the conventional STT-MRAM memory cell 32 is limited to about 8 $F^2$, where F denotes the minimum feature size or one half the minimum feature pitch normally associated with a particular manufacturing process, because of the access transistor 34. While the access transistor 32 may be replaced by a two-terminal selector device to reduce the memory cell size down to 4 $F^2$, conventional bidirectional selector devices, such as Ovonic threshold switch, are prone to current leakage compared with access transistors.

For the foregoing reasons, there is a need for a two-terminal bidirectional selector device for memory applications that has low current leakage and that can be inexpensively manufactured.

SUMMARY

The present invention is directed to a selector device that satisfies this need. A magnetic memory cell having features of the present invention includes a magnetic tunnel junction (MTJ) electrically connected to a two-terminal bidirectional selector in series between two conductive lines. The MTJ includes a magnetic free layer having a variable magnetization direction substantially perpendicular to a layer plane thereof; a magnetic reference layer having an invariable magnetization direction substantially perpendicular to a layer plane thereof; and an insulating tunnel junction layer interposed between the magnetic free and reference layers. The two-terminal bidirectional selector includes a bottom electrode; a top electrode; a load-resistance layer interposed between the bottom and top electrodes and comprising a first tantalum oxide; a first volatile switching layer interposed between the bottom and top electrodes and comprising a metal dopant and a second tantalum oxide that has a higher oxygen content than the first tantalum oxide; and a second volatile switching layer in contact with the first volatile switching layer and comprising a third tantalum oxide that has a higher oxygen content than the first tantalum oxide.

According to another aspect of the present invention, a magnetic memory cell includes a magnetic tunnel junction (MTJ) electrically connected to a two-terminal bidirectional selector in series between two conductive lines. The MTJ includes a magnetic free layer having a variable magnetization direction substantially perpendicular to a layer plane thereof; a magnetic reference layer having an invariable magnetization direction substantially perpendicular to a layer plane thereof; and an insulating tunnel junction layer interposed between the magnetic free and reference layers. The two-terminal bidirectional selector includes a bottom electrode; a top electrode; a load-resistance layer interposed between the bottom and top electrodes and comprising a first tantalum oxide; a first volatile switching layer interposed between the bottom and top electrodes and comprising a metal dopant and a second tantalum oxide that has a higher oxygen content than the first tantalum oxide; and a second volatile switching layer in contact with the first volatile switching layer and comprising a stoichiometric or near-stoichiometric hafnium oxide.

According to still another aspect of the present invention, a magnetic memory cell includes a magnetic tunnel junction (MTJ) electrically connected to a two-terminal bidirectional selector in series between two conductive lines. The MTJ includes a magnetic free layer having a variable magnetization direction substantially perpendicular to a layer plane thereof; a magnetic reference layer having an invariable magnetization direction substantially perpendicular to a layer plane thereof; and an insulating tunnel junction layer interposed between the magnetic free and reference layers. The two-terminal bidirectional selector includes bottom and top electrodes with each independently comprising one of titanium nitride or iridium; a load-resistance layer interposed between the bottom and top electrodes and comprising a first tantalum oxide and a metal dopant; a first volatile switching layer interposed between the bottom and top electrodes and comprising the metal dopant and a second tantalum oxide that has a higher oxygen content than the first tantalum oxide; a second volatile switching layer in contact with the first volatile switching layer and comprising a stoichiometric tantalum oxide that has a higher oxygen content than the first tantalum oxide; and a third volatile switching layer in contact with the second volatile switching layer opposite the first volatile switching layer, the third volatile switching layer comprising the second tantalum oxide and the metal dopant, which is silver or copper.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Where reference is made herein to a material AB composed of element A and element B, the material AB can be an alloy, a compound, or a combination thereof, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

Figure 1:
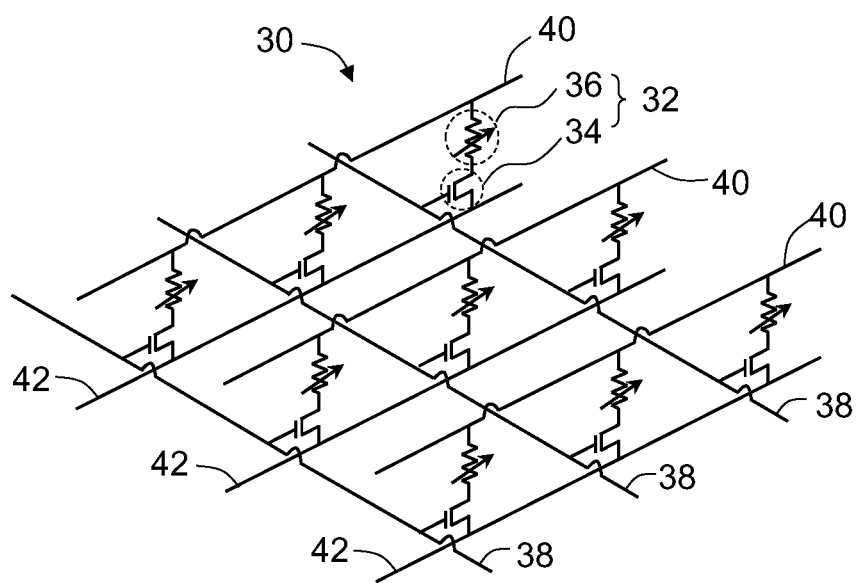
FIG. 1 is a schematic circuit diagram for a conventional STT-MRAM array incorporating access transistors in magnetic memory cells.
Figure 2A:
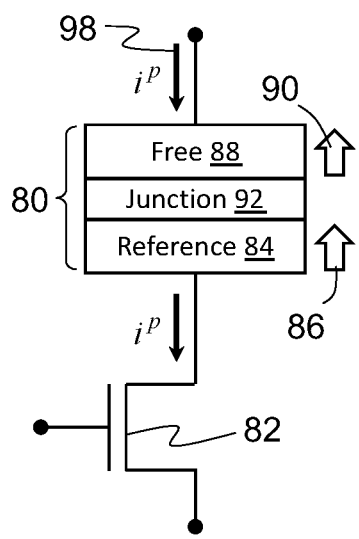
FIGS. 2A and 2B illustrate switching of magnetic tunnel junction from high to low resistance state and from low to high resistance state, respectively.
Figure 2B:
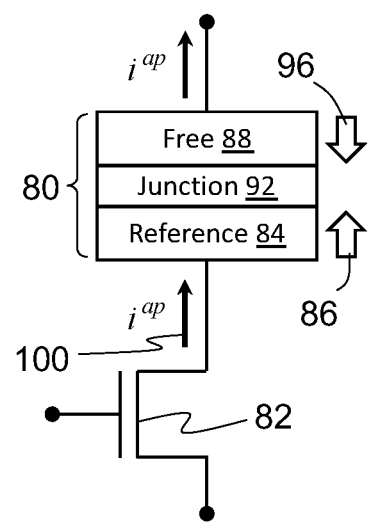
Figure 3:
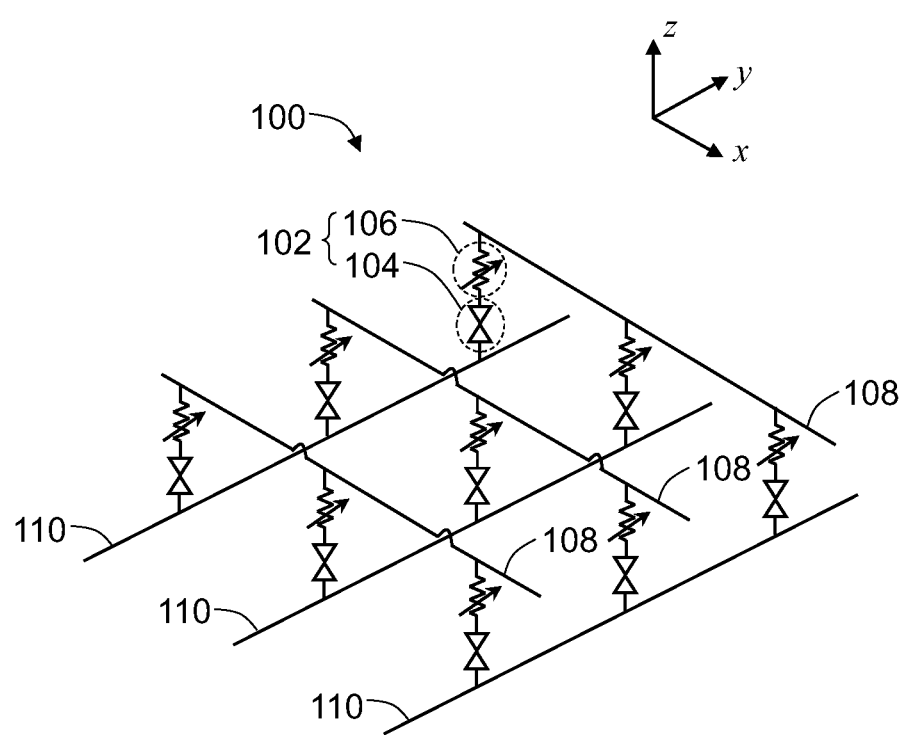
FIG. 3 is a schematic circuit diagram for an STT-MRAM array including incorporating two-terminal bidirectional selectors in magnetic memory cells.

FIG. 3 is a schematic circuit diagram of an exemplary STT-MRAM array incorporating two-terminal bidirectional selectors in magnetic memory cells. The MRAM array 100 comprises a plurality of magnetic memory cells 102 with each of the magnetic memory cells 102 including a two-terminal bidirectional selector 104 coupled to an MTJ memory element 106 in series; a plurality of first conductive lines 108 with each being coupled to a respective row of the MTJ memory elements 106 in the x-direction; and a plurality of second conductive lines 110 with each being coupled to a respective column of the bidirectional selectors 104 in the y-direction substantially perpendicular to the x-direction. Accordingly, the magnetic memory cells 102 are located at the cross points between the first and second conductive lines 108 and 110. The stacking order of the MTJ memory elements 106 and the selectors 104 may be inverted such that the MTJ memory elements 106 and the selectors 104 are disposed adjacent to the second and first conductive lines 110 and 108, respectively. The first and second conductive lines 108 and 110 may function as word lines and bit lines, respectively. Alternatively, The first and second conductive lines 108 and 110 may function as bit lines and word lines, respectively. Multiple MRAM arrays 100 may be stacked during processing to form a monolithic three-dimensional memory block.

Figure 4A:
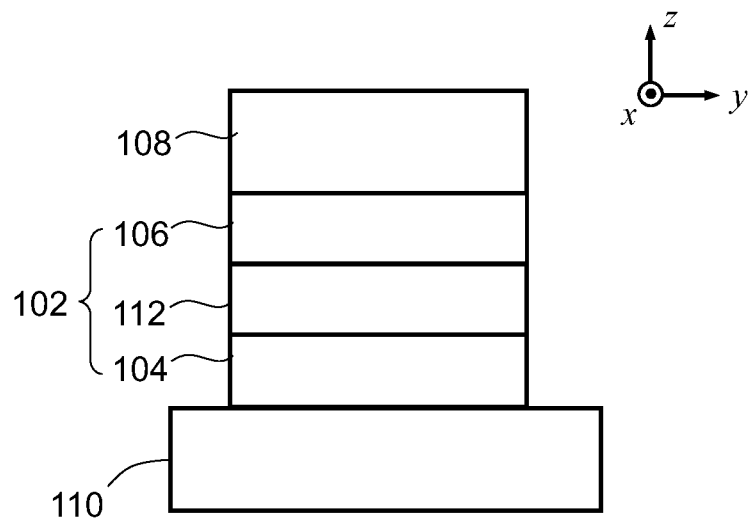
FIGS. 4A and 4B are cross-sectional views of a magnetic memory cell in accordance with different embodiments of the present invention.

An embodiment of the present invention as applied to the magnetic memory cells 102 of FIG. 3 will now be described with reference to FIG. 4A, which is a cross-sectional view of one of the magnetic memory cells 102. Referring now to FIG. 4A, a magnetic memory cell 102 includes a bidirectional selector 104 formed adjacent to a second conductive line 110, an MTJ memory element 106 formed adjacent to a first conductive line 108, and an optional intermediate electrode 112, if present, interposed between the bidirectional selector 104 and the MTJ memory element 106. In embodiments where the optional intermediate electrode 112 is absent, the magnetic memory element 106 may be directly coupled to the bidirectional selector 104. The magnetic memory cell 102 may be electrically connected to the first conductive line 108 and/or the second conductive line 110 via one or more intervening electrodes (not shown).

Figure 4B:
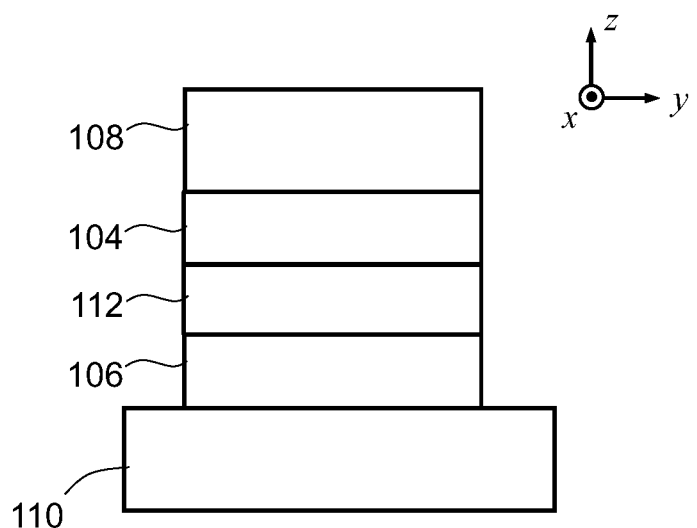

The stacking order of the bidirectional selector 104 and the MTJ memory element 106 may be inverted, as illustrated in FIG. 4B, such that the bidirectional selector 104 is formed adjacent to the first conductive line 108; the magnetic memory element 106 is formed adjacent to the second conductive line 110; and the optional intermediate electrode 112 is interposed between the bidirectional selector 104 and the magnetic memory element 106.

The first and second conductive lines 108 and 110 may each independently comprise any suitable conductor, such as but not limited to copper (Cu), tungsten (W), aluminum (Al), silver (Ag), gold (Au), titanium (Ti), ruthenium (Ru), iridium (Ir), platinum (Pt), palladium (Pd), tantalum (Ta), titanium nitride ($TiN_x$), tantalum nitride ($TaN_x$), or any combination thereof.

The optional intermediate electrode 112 may comprise any suitable conductor, such as but not limited to copper (Cu), tungsten (W), aluminum (Al), silver (Ag), gold (Au), titanium (Ti), ruthenium (Ru), iridium (Ir), platinum (Pt), palladium (Pd), tantalum (Ta), titanium nitride ($TiN_x$), tantalum nitride ($TaN_x$), tungsten silicide ($WSi_x$), titanium silicide ($TiSi_x$), cobalt silicide ($CoSi_x$), nickel silicide ($NiSi_x$), platinum silicide ($PtSi_x$), or any combination thereof.

The MTJ memory element 106 may include a magnetic free layer having a variable magnetization direction substantially perpendicular to a layer plane thereof, a magnetic reference layer having an invariable magnetization direction substantially perpendicular to a layer plane thereof, and an insulating tunnel junction layer interposed therebetween. Alternatively, the magnetic free and reference layers may have magnetization directions that are oriented parallel to the layer planes thereof.

Figure 5A:
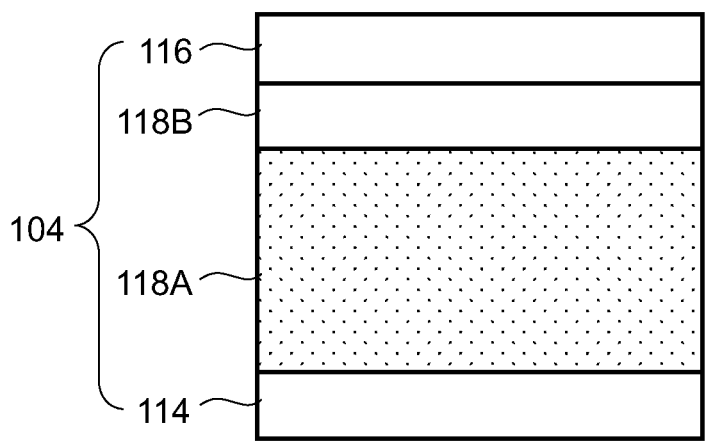
FIGS. 5A and 5B are cross-sectional views illustrating the structure of a two-terminal bidirectional selector in accordance with an embodiment of the present invention.

FIG. 5A is a cross-sectional view illustrating the structure of the two-terminal bidirectional selector 104 in accordance with an embodiment of the present invention. The selector 104 includes a bottom electrode 114, a top electrode 116, and first and second volatile switching layers 118A and 118B interposed between the bottom and top electrodes 114 and 116. The first and second volatile switching layers 118A and 118B have different compositions and electrical resistances. The stacking order of the first and second volatile switching layers 118A and 118B may be inverted, such that the first and second volatile switching layers 118A and 118B are formed adjacent to the top and bottom electrodes 116 and 114, respectively.

The first volatile switching layer 118A may have a relatively lower electrical resistance than the second volatile switching layer 118B and may comprise a suitable oxide, which may be further doped with one or more conductive elements. The oxide may be stoichiometric or non-stoichiometric (i.e., metal-rich). Examples of the suitable oxide for the first volatile switching layer 118A may include tantalum oxide ($TaO_x$), titanium oxide ($TiO_x$), aluminum oxide ($AlO_x$), zinc oxide ($ZnO_x$), zirconium oxide ($ZrO_x$), tungsten oxide ($WO_x$), hafnium oxide ($HfO_x$), niobium oxide ($NbO_x$), magnesium oxide ($MgO_x$), gallium oxide ($GaO_x$), and gadolinium oxide ($GdO_x$). Examples of the conductive element dopant may include silver (Ag), gold (Au), copper (Cu), nickel (Ni), tellurium (Te), and cobalt (Co).

The second volatile switching layer 118B may comprise a suitable stoichiometric or non-stoichiometric (i.e., metal-rich) oxide, such as but not limited to tantalum oxide ($TaO_y$), aluminum oxide ($AlO_y$), zinc oxide ($ZnO_y$), zirconium oxide ($ZrO_y$), tungsten oxide ($WO_y$), hafnium oxide ($HfO_y$), niobium oxide ($NbO_y$), magnesium oxide ($MgO_y$), gallium oxide ($GaO_y$), gadolinium oxide ($GdO_y$), and silicon oxide ($SiO_y$). The oxide of the second volatile switching layer 118B may have a higher electrical resistivity than the oxide of the first volatile switching layer 118A.

In an embodiment, the first volatile switching layer 118A is made of a same oxide as the second volatile switching layer 118B but has a higher metal content in the oxide to decrease the electrical resistance. For example, the first and second volatile switching layers 118A and 118B may comprise a non-stoichiometric and stoichiometric tantalum oxide, respectively. Alternatively, the first and second volatile switching layers 118A and 118B may comprise $TaO_x$, and $TaO_y$, respectively, where y>x. Alternatively, the first and second volatile switching layers 118A and 118B may comprise a non-stoichiometric and stoichiometric hafnium oxide, respectively. The non-stoichiometric tantalum oxide or hafnium oxide of the the first volatile switching layer 118A may be further doped with a conductive element, such as silver, copper, nickel, or tellurium. In another embodiment, the first and second volatile switching layers 118A and 118B are made of different oxides. For example, the first and second volatile switching layers 118A and 118B may comprise tantalum oxide and hafnium oxide, respectively. The hafnium oxide may be stoichiometric or near stoichiometric, while the tantalum oxide may be non-stoichiometric and/or doped with silver, copper, cobalt, nickel, or tellurium.

The bottom and top electrodes 114 and 116 may each independently comprise any suitable electrode material, such as but not limited to platinum (Pt), iridium (Ir), ruthenium (Ru), palladium (Pd), titanium (Ti), tungsten (W), tantalum (Ta), aluminum (Al), copper (Cu), indium-tin oxide (ITO), gold (Au), silver (Ag), nickel (Ni), titanium nitride ($TiN_x$), tantalum nitride ($TaN_x$), or any combination thereof. In one embodiment, the bottom and top electrodes 114 and 116 are made of the same material, or are "symmetric" with respect to the switching layers 118A and 118B. For example, the bottom and top electrodes 114 and 116 may both be made of iridium, tantalum, tantalum nitride, or titanium nitride. In an alternative embodiment, the bottom and top electrodes 114 and 116 are made of different materials, or are "asymmetric" with respect to the switching layers 118A and 118B.

Figure 5B:
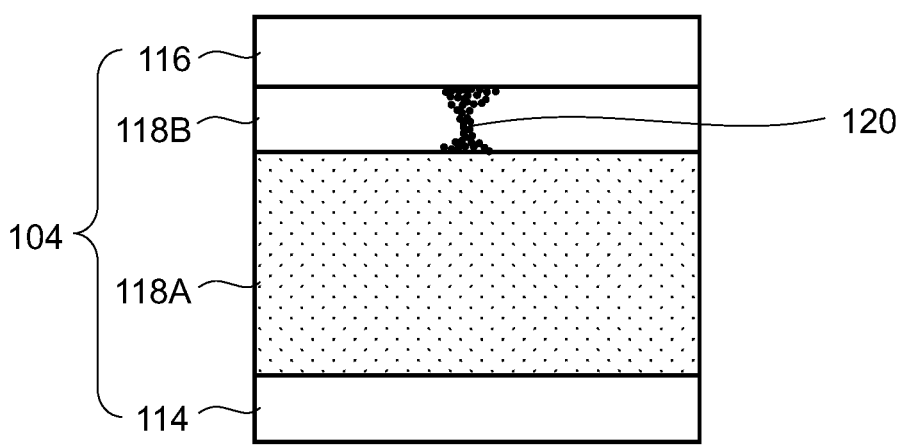

Being a volatile device, the selector 104 shown in FIG. 5A is essentially insulating or non-conductive in the absence of a voltage applied to the two electrodes 114 and 116. However, when a voltage sufficiently high (i.e., switching voltage) is applied to the selector 104, a conductive filament 120 may form in the second volatile switching layer 118B as shown in FIG. 5B, thereby rendering the selector 104 conductive. The conductive filament 120 may comprise metal atoms and/or ions from the metal-rich oxide of the first volatile switching layer 118A or conductive dopants from the first volatile switching layer 118A. After applying the switching voltage one or more times, some of the metal atoms and/or ions of the conductive filament may remain in the second volatile switching layer 118B even in the absence of an applied voltage.

Figure 6A:
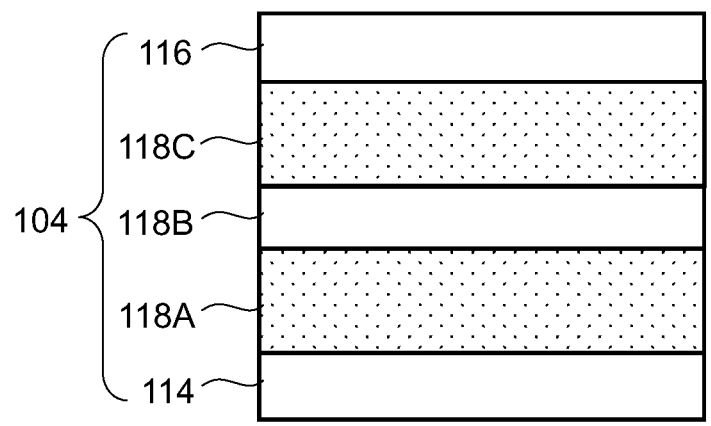
FIGS. 6A and 6B are cross-sectional views illustrating the structure of a two-terminal bidirectional selector in accordance with another embodiment of the present invention.

FIG. 6A is a cross-sectional view illustrating the structure of the two-terminal bidirectional selector 104 in accordance with another embodiment of the present invention. In the drawing, numerals 114-118A and 118B denote the same components as those shown in FIG. 5A. The embodiment of FIG. 6A is different from the embodiment of FIG. 5A in that the selector 104 includes a third volatile switching layer 118C formed adjacent to the second volatile switching layer 118B opposite the first volatile switching layer 118A. The second and third volatile switching layers 118B and 118C have different compositions and electrical resistances. The stacking order of the first, second, and third volatile switching layers 118A, 118B, 118C may be inverted, such that the first and third volatile switching layers 118A and 118C are formed adjacent to the top and bottom electrodes 116 and 114, respectively.

Analogous to the first volatile switching layer 118A, the third volatile switching layer 118C may have a relatively lower electrical resistance than the second volatile switching layer 118B and may independently comprise a suitable oxide, which may be further doped with one or more conductive elements. The oxide may be stoichiometric or non-stoichiometric (i.e., metal-rich). Examples of the suitable oxide for the third volatile switching layer 118C may include tantalum oxide ($TaO_x$), titanium oxide ($TiO_x$), aluminum oxide ($AlO_x$), zinc oxide ($ZnO_x$), zirconium oxide ($ZrO_x$), tungsten oxide ($WO_x$), hafnium oxide ($HfO_x$), niobium oxide ($NbO_x$), magnesium oxide ($MgO_x$), gallium oxide ($GaO_x$), and gadolinium oxide ($GdO_x$). The oxide of the third volatile switching layer 118C may have a lower electrical resistivity than the oxide of the second volatile switching layer 118B. Examples of the conductive element dopant may include silver (Ag), gold (Au), copper (Cu), nickel (Ni), tellurium (Te), and cobalt (Co).

In an embodiment, the first and third volatile switching layers 118A and 118C have a same composition. For example, the first and third volatile switching layers 118A and 118C may comprise a same oxide, such as tantalum oxide or hafnium oxide, which may be further doped with silver, copper, cobalt, nickel, or tellurium. In another embodiment, the first and third volatile switching layers 118A and 118C may each comprise a non-stoichiometric tantalum oxide doped with silver, and the second volatile switching layer 118B may comprise hafnium oxide, which may be stoichiometric or near stoichiometric.

Figure 6B:
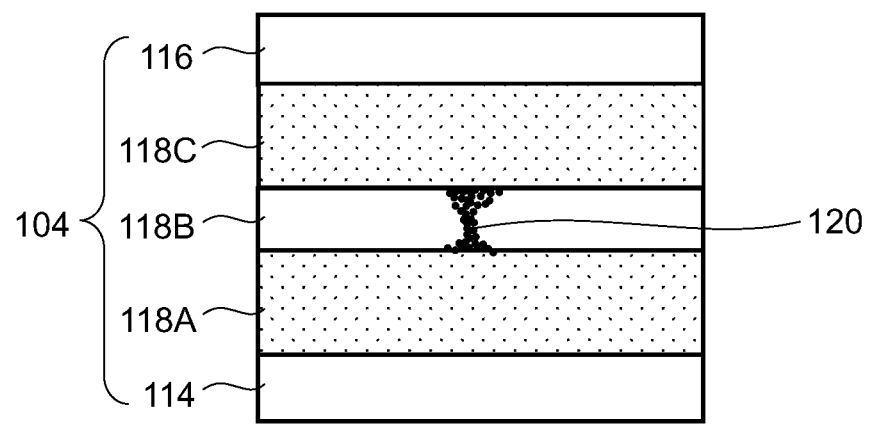

Analogous to the embodiment of FIG. 5B, FIG. 6B shows that when a voltage sufficiently high (i.e., switching voltage) is applied to the selector 104, a conductive filament 120 may form in the second volatile switching layer 118B, thereby rendering the selector 104 conductive. The conductive filament 120 may comprise metal atoms and/or ions from at least one of the metal-rich oxides of the first and third volatile switching layers 118A and 118C or conductive dopants from at least one of the first and third volatile switching layers 118A and 118C. After applying the switching voltage one or more times, some of the metal atoms and/or ions of the conductive filament may remain in the second volatile switching layer 118B even in the absence of an applied voltage.

Operation of the two-terminal bidirectional selectors 104 of embodiments of FIGS. 5A/B and 6A/B will now be described with reference to the current-voltage (I-V) response plot illustrated in FIG. 7. The exemplary I-V plot shows the magnitude of electric current passing through one of the selectors 104 without a load coupled thereto as the applied voltage varies. Initially, the selector 104 is in an insulating or high resistance state as the current gradually increases with the applied voltage from zero to near a threshold voltage, $V_{th}$. At or near $V_{th}$, the current rapidly increases and exhibits a highly non-linear behavior, indicating a transition from the insulating or high resistance state to a conductive state for the selector 104. As the voltage continues to increase beyond $V_{th}$, the current increase becomes gradual again until reaching $I_{on}$, which is the programming current for the MTJ memory element 106, and corresponding voltage $V_p$, respectively. The current response behaves like a step function as the applied voltage increases from zero to $V_p$ with the sharp increase occurring at or near $V_{th}$, which may include a narrow range of voltage values.

Without being bound to any theory, it is believed that at least one conductive filament is formed within the second switching layer 118B, as illustrated in FIGS. 5B and 6B, when the selector voltage exceeds $V_{th}$, resulting in the selector 104 being in a highly conductive state. In response to the applied voltage that is greater than $V_{th}$, dopants and/or metal atoms or ions from at least one of the first and third volatile switching layers 118A and 118C may migrate into the second volatile switching layer 118B to form a conductive filament, thereby forming a conductive path between the bottom and top electrodes 114 and 116. It is also possible that metal atoms or ions within the second volatile switching layer 118B may migrate or diffuse to form the conductive filament 120. Therefore, the metal atoms or ions for forming the conductive filament 120 may come from at least one of the first and third volatile switching layers 118A and 118C, or the second volatile switching layer 118B, or both. It should be noted that there are various possible mechanisms that can cause ions to migrate or diffuse, such as but not limited to electric field, electric current, and joule heating, in the presence of the applied voltage.

Figure 7:
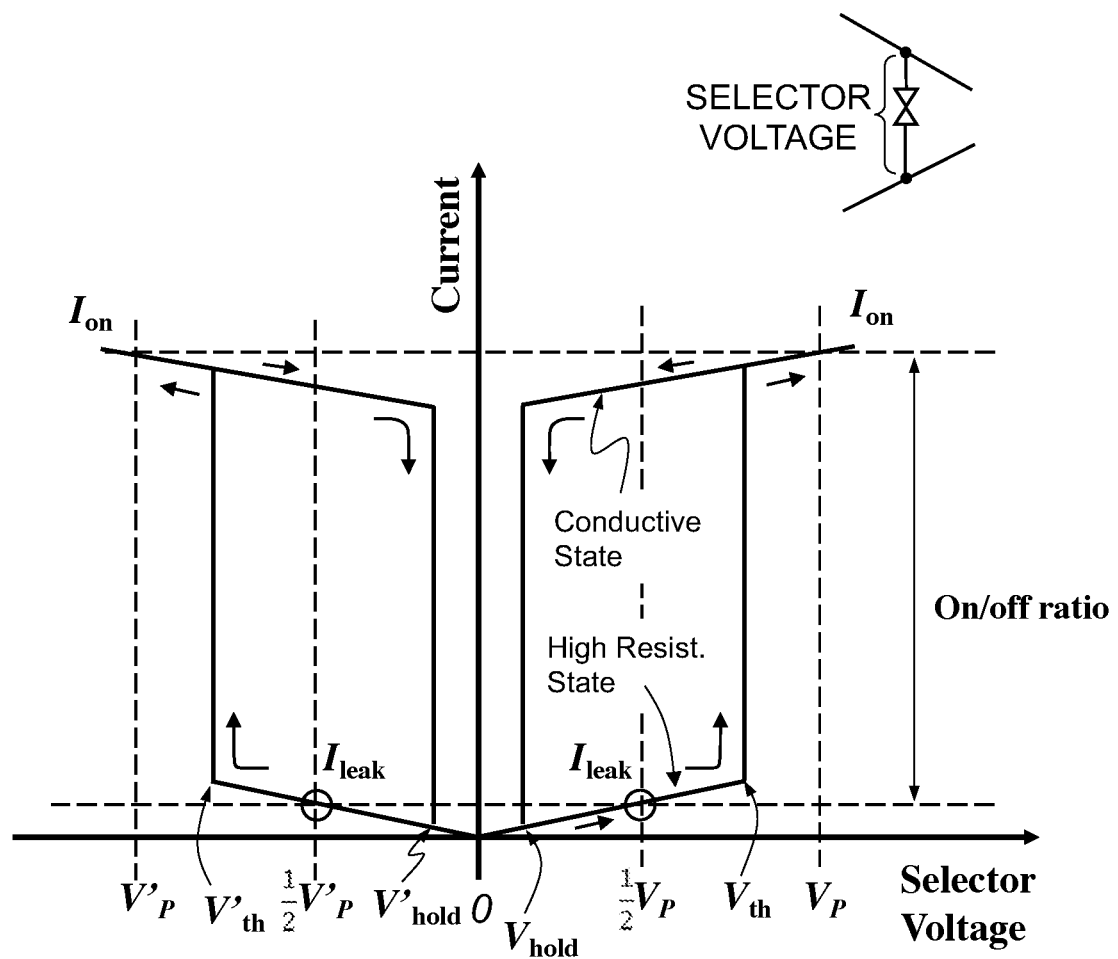
FIG. 7 is an exemplary I-V response plot corresponding to the selectors of embodiments of FIGS. 5A/B and 6A/B.

With continuing reference to FIG. 7, as the selector voltage decreases from $V_p$ to near a holding voltage, $V_{hold}$, that is lower than $V_{th}$, the current gradually decreases and the selector 104 remain in the highly conductive state. The conductive filament 120 previously formed in the second volatile switching layer 118B may remain mostly intact as illustrated in FIGS. 5B and 6B.

At or near $V_{hold}$, the selector current rapidly decreases and exhibits a highly non-linear behavior, indicating a transition from the highly conductive state back to the insulating or high resistance state. As the voltage continues to decrease beyond $V_{hold}$, the current decrease becomes gradual again. When the voltage drops below $V_{hold}$, the conductive filament 120 may disintegrate, returning the selector 104 back to the insulating or high resistance state. At zero voltage, the conductive filament 120 may remain disintegrated and the second volatile switching layer 118B remains in the original insulating or high resistance state.

The I-V response of the selectors 104 of the embodiments of FIGS. 5A/B and 6A/B is characterized by a hysteresis behavior as the applied voltage increases from zero to $V_p$ and decreases back to zero again as illustrated in FIG. 7. The current response behaves like a step function as the applied voltage increases from zero to $V_p$ with the sharp increase occurring at or near $V_{th}$, which marks the transition from the insulating or high resistance state to the conductive state. As the voltage decreases from $V_p$ to zero, the current markedly decreases at or near $V_{hold}$, which is lower than $V_p$ and marks the transition from the conductive state back to the insulating or high resistance state. Accordingly, when the selector voltage is between $V_{hold}$ and $V_{th}$, the selector 104 may be in either the conductive state or the insulating state. The difference in the electrical resistance between the conductive state and the insulating or high resistance state at a given selector voltage may range from five to eight orders of magnitude.

The two-terminal selectors 104 of the embodiments of FIGS. 5A/B and 6A/B are bidirectional as the polarity of the applied voltage may be reversed as illustrated in the I-V plot of FIG. 7. The IV-response corresponding to the opposite polarity is also characterized by a hysteresis behavior as the applied voltage increases from zero to $V'_p$ and decreases back to zero again. As the selector voltage increases from zero to $V'_p$, a sharp rise in current at or near $V'_{th}$, indicating the transition from the insulating or high resistance state to the conductive state. As the selector voltage decreases from $V'_p$ back to zero, a sharp drop in current at or near $V'_{hold}$, which is lower than $V'_{th}$ and marks the transition from the conductive state back to the insulating or high resistance state.

While the two I-V loops corresponding to the two opposite voltage polarities, as shown in FIG. 7, are substantially symmetric with respect to the vertical current axis (i.e., $V_{th} \approx V'_{th}$ and $V_{hold} \approx V'_{hold}$), the selectors 104 of the embodiments of FIGS. 5A/B and 6A/B may alternatively exhibit asymmetric I-V response loops (i.e., $V_{th} \neq V'_{th}$ and/or $V_{hold} \neq V'_{hold}$), depending on the compositions of the volatile switching layers 118A-118C and the electrodes 114 and 116.

The process of forming may be applied to the selectors 104 of the embodiments of FIGS. 5A/B and 6A/B to form an initial conductive filament in the as-deposited second volatile switching layer 118B prior to operation. FIG. 8A shows that a forming voltage, $V_{forming}$, which is equal to or greater than $V_{th}$, is applied to the selector 104 of FIGS. 5A/B to form the initial filament 120 in the second volatile switching layer 118B. The forming voltage may exert an electric field that causes dopants and/or metal ions in the first volatile switching layer 118A to migrate or diffuse into the second volatile switching layer 118B to form the initial conductive filament 120. Likewise, FIG. 8B shows the forming voltage being applied to the selector 104 of FIGS. 6A/B to form the initial filament 120 in the second volatile switching layer 118B. The forming voltage may exert an electric field that causes dopants and/or metal ions in the first or third volatile switching layer 118A or 118C to migrate or diffuse into the second volatile switching layer 118B to form the initial conductive filament 120. The forming process may ensure that only one conductive filament is formed in the second volatile switching layer 118B when the selector is in the conductive state. Sidewall oxidation of the selector may further help to centralize the conductive filament, thereby ensuring only one conductive filament is formed in the second volatile switching layer 118 of a selector.

Compared to the threshold switching selectors 104 of the embodiments of FIGS. 5A/B and 6A/B characterized by distinctive insulating and conductive states, the electrical resistances of which may differ by more than 6 orders of magnitude at a given applied voltage (i.e., between $V_{th}$ and $V_{hold}$), conventional bidirectional selectors that conduct current via electron tunneling mechanism do not exhibit a clear threshold effect. Instead, the current simply increases and decreases non-linearly with the applied voltage without showing the I-V hysteresis loop, which may cause conventional bidirectional selectors to have high current leakage.

Since the selectors 104 of the embodiments of FIGS. 5A/B and 6A/B may exhibit very low electrical resistance (e.g., ~1 kΩ) in the conductive state, a relatively high current may be required to maintain the selector voltage above $V_{hold}$ during the read operation. However, the use of the relatively high current to maintain the selector in the conductive state during the read operation may accidentally cause the unintentional switching of the MTJ memory element, commonly known as "read disturbance." Therefore, it may be desirable to increase the electrical resistance of the selector in the conductive state.

Figure 8:
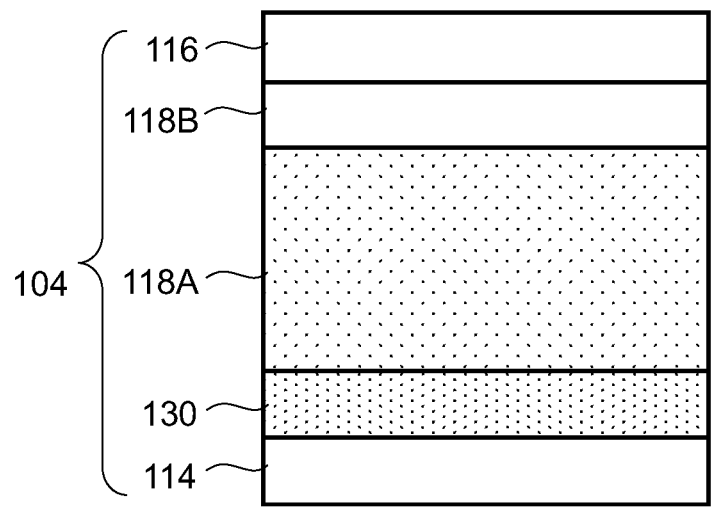
FIG. 8 is a cross-sectional view illustrating the structure of a two-terminal bidirectional selector in accordance with still another embodiment of the present invention.

FIG. 8 is a cross-sectional view illustrating the structure of the two-terminal bidirectional selector 104 in accordance with still another embodiment of the present invention. In the drawing, numerals 114-118A and 118B denote the same components as those shown in FIG. 5A. The embodiment of FIG. 8 is different from the embodiment of FIG. 5A in that the selector 104 further includes a load-resistance layer 130 formed between the first volatile switching layer 118A and the bottom electrode 114. The load-resistance layer 130 increases the resistance of the selector 104 in the conductive state, thereby minimizing the current surge when the selector 104 is activated and reducing the current required to maintain the selector 104 in the conductive state. Therefore, the load-resistance layer 130 provides a self-compliance functionality to the selector 104 of the embodiment of FIG. 8.

The load-resistance layer 130 may comprise a suitable oxide, which may be further doped with one or more conductive elements. The oxide may be stoichiometric or non-stoichiometric (i.e., metal-rich). Examples of the suitable oxide for the load-resistance layer 130 may include tantalum oxide ($TaO_z$), titanium oxide ($TiO_z$), aluminum oxide ($AlO_z$), zinc oxide ($ZnO_z$), zirconium oxide ($ZrO_z$), tungsten oxide ($WO_z$), hafnium oxide ($HfO_z$), niobium oxide ($NbO_z$), magnesium oxide ($MgO_z$), gallium oxide ($GaO_z$), and gadolinium oxide ($GdO_z$). Examples of the conductive element dopant may include silver (Ag), gold (Au), copper (Cu), nickel (Ni), tellurium (Te), and cobalt (Co).

In an embodiment, the load-resistance layer 130 and the first and second volatile switching layers 118A and 118B are made of oxides having a same metal constituent but have different oxygen contents. The oxide of the load-resistance layer 130 may have the lowest oxygen content, while the first and second volatile switching layers 118A and 118B may have higher oxygen contents. The load-resistance layer 130 and/or the first volatile switching layer 118A may be further doped with one or more conductive elements. For example, the load-resistance layer 130 and the first and second volatile switching layers 118A and 118B may comprise $TaO_z$, $TaO_x$ and $TaO_y$, respectively, where y>x>z or y≈x>z. The tantalum oxide $TaO_y$ may be a stoichiometric or near-stoichiometric oxide; $TaO_x$ may be a stoichiometric or non-stoichiometric (metal-rich) oxide; and $TaO_z$ may be a non-stoichiometric (metal-rich) oxide. The tantalum oxides $TaO_y$ and $Ta_x$ may have higher electrical resistivities than $TaO_z$. Alternatively, the load-resistance layer 130 and the first and second volatile switching layers 118A and 118B may comprise $HfO_z$, $HfO_x$ and $HfO_y$, respectively, where y>x>z or y≈x>z. The hafnium oxide $HfO_y$ may be a stoichiometric or near-stoichiometric oxide; $HfO_x$ may be a stoichiometric or non-stoichiometric (metal-rich) oxide; and $HfO_z$ may be a non-stoichiometric (metal-rich) oxide. The hafnium oxides $HfO_y$ and $HfO_x$ may have higher electrical resistivities than $HfO_z$. The oxides $TaO_x$ and $HfO_x$ of the first volatile switching layer 118A may be doped with silver, copper, cobalt, nickel, tellurium, or any combination thereof. Similarly, $TaO_z$ and $HfO_z$ of the load-resistance layer 130 may be doped with silver, copper, cobalt, nickel, tellurium, or any combination thereof.

In another embodiment, the second volatile switching layer 118B is made of a different oxide from the oxides of the other two layers 118A and 130. The oxide of the second volatile switching layer 118B may have a higher electrical resistivity than the oxides of the load-resistance layer 130 and the first volatile switching layer 118A. The load-resistance layer 130 and/or the first volatile switching layer 118A may be further doped with one or more conductive elements. For example, the second volatile switching layer 118B may comprise a hafnium oxide, while the load-resistance layer 130 and the first volatile switching layer 118A may comprise $TaO_z$ and $TaO_x$, respectively, where $x>z$. The hafnium oxide may be stoichiometric or near-stoichiometric, while $TaO_x$ may be a stoichiometric or non-stoichiometric (metal-rich) oxide and $TaO_z$ may be a non-stoichiometric (metal-rich) oxide. The oxide $TaO_z$ and/or $TaO_x$ may be doped with silver, copper, cobalt, nickel, tellurium, or any combination thereof.

The load-resistance layer 130 of the embodiment of FIG. 8 may alternatively be disposed between the second volatile switching layer 118B and the top electrode 116. The stacking order of the first and second volatile switching layers 118A and 118B may be inverted with the load-resistance layer 130 formed adjacent to either the bottom electrode 114 or the top electrode 116.

Figure 9:
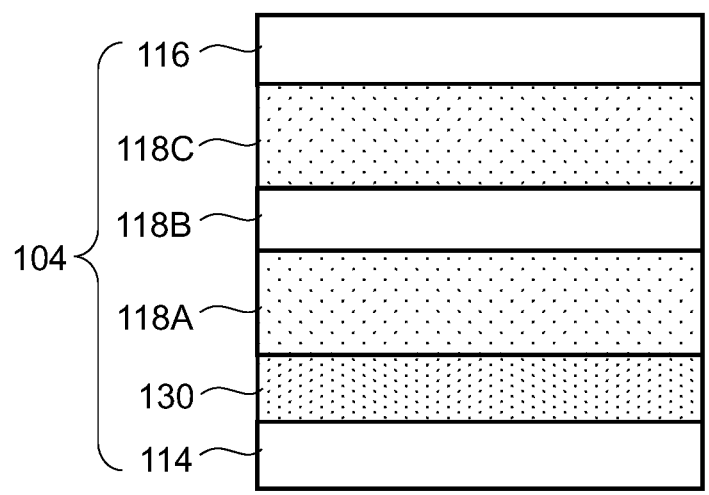
FIG. 9 is a cross-sectional view illustrating the structure of a two-terminal bidirectional selector in accordance with yet another embodiment of the present invention.

FIG. 9 is a cross-sectional view illustrating the structure of the two-terminal bidirectional selector 104 in accordance with yet another embodiment of the present invention. In the drawing, numerals 114-118C denote the same components as those shown in FIG. 6A. The embodiment of FIG. 9 differs from the embodiment of FIG. 6A in that the selector 104 further includes a load-resistance layer 130 formed between the first volatile switching layer 118A and the bottom electrode 114. The load-resistance layer 130 increases the resistance of the selector 104 in the conductive state, thereby minimizing the current surge when the selector 104 is activated and reducing the current required to maintain the selector 104 in the conductive state. Therefore, the load-resistance layer 130 provides a self-compliance functionality to the selector 104 of the embodiment of FIG. 9.

The load-resistance layer 130 may comprise a suitable oxide, which may be further doped with one or more conductive elements. The oxide may be stoichiometric or non-stoichiometric (i.e., metal-rich). Examples of the suitable oxide for the load-resistance layer 130 may include tantalum oxide ($TaO_z$), titanium oxide ($TiO_z$), aluminum oxide ($AlO_z$), zinc oxide ($ZnO_z$), zirconium oxide ($ZrO_z$), tungsten oxide ($WO_z$), hafnium oxide ($HfO_z$), niobium oxide ($NbO_z$), magnesium oxide ($MgO_z$), gallium oxide ($GaO_z$), and gadolinium oxide ($GdO_z$). Examples of the conductive element dopant may include silver (Ag), gold (Au), copper (Cu), nickel (Ni), tellurium (Te), and cobalt (Co).

In an embodiment, the load-resistance layer 130 and the first, second, and third volatile switching layers 118A-118C are made of oxides having a same metal constituent but have different oxygen contents. The oxide of the load-resistance layer 130 may have the lowest oxygen content and lowest electrical resistivity, while the oxides of the first, second, and third volatile switching layers 118A-118C may have higher oxygen contents and higher electrical resistivities. The load-resistance layer 130 and/or the first and third volatile switching layers 118A and 118C may be further doped with one or more conductive elements. For example, the load-resistance layer 130 and the first, second, and third volatile switching layers 118A-118C may comprise $TaO_z$, $TaO_x$, $TaO_y$, and $TaO_{x'}$, respectively, where $y \approx x \approx x' > z$, or $y > x > x' > z$, or $y > x' > x > z$, or $y > x \approx x' > z$. The tantalum oxide $TaO_y$ may be a stoichiometric or near-stoichiometric oxide; $TaO_x$ and $TaO_{x'}$ may be stoichiometric or non-stoichiometric (metal-rich) oxides; and $TaO_z$ may be a non-stoichiometric (metal-rich) oxide. Alternatively, the load-resistance layer 130 and the first, second, and third volatile switching layers 118A-118C may comprise $HfO_z$, $HfO_x$, $HfO_y$, and $HfO_{x'}$, respectively, where $y \approx x \approx x' > z$, or $y > x > x' > z$, or $y > x' > x > z$, or $y > x \approx x' > z$. The hafnium oxide $HfO_y$ may be a stoichiometric or near-stoichiometric oxide; $HfO_x$ and $HfO_{x'}$ may be stoichiometric or non-stoichiometric (metal-rich) oxides; and $HfO_z$ may be a non-stoichiometric (metal-rich) oxide. The $TaO_x$, $HfO_x$, $TaO_{x'}$, and $HfO_{x'}$ oxides of the first and third volatile switching layers 118A and 118C may be further doped with silver, copper, cobalt, nickel, tellurium, or any combination thereof. The $TaO_z$ and $HfO_z$ oxides of the load-resistance layer 130 may be further doped with silver, copper, cobalt, nickel, tellurium, or any combination thereof.

In another embodiment, the second volatile switching layer 118B is made of a different oxide from the oxides of the other three layers 118A, 118C, and 130. The oxide of the second volatile switching layer 118B may have a higher electrical resistivity than the oxides of the other three layers 118A, 118C, and 130. The load-resistance layer 130 and/or the first and third volatile switching layers 118A and 118C may be further doped with one or more conductive elements. For example, the second volatile switching layer 118B may comprise a hafnium oxide, while the load-resistance layer 130 and the first and third volatile switching layers 118A and 118C may comprise $TaO_z$, $TaO_x$, and $TaO_{x'}$, respectively, where $x > x' > z$, or $x' > x > z$, or $x \approx x' > z$. The hafnium oxide $HfO_y$ may be a stoichiometric or near-stoichiometric oxide; $TaO_x$ and $TaO_{x'}$ may be stoichiometric or non-stoichiometric (metal-rich) oxides; and $TaO_z$ may be a non-stoichiometric (metal-rich) oxide. The tantalum oxides $TaO_x$ and $TaO_{x'}$ of the first and third volatile switching layers 118A and 118C may be further doped with silver, copper, cobalt, nickel, tellurium, or any combination thereof. The $TaO_z$ oxide of the load-resistance layer 130 may be further doped with silver, copper, cobalt, nickel, tellurium, or any combination thereof.

The load-resistance layer 130 of the embodiment of FIG. 9 may alternatively be disposed between the third volatile switching layer 118C and the top electrode 116. The stacking order of the first, second, and third volatile switching layers 118A, 118B, 118C may be inverted, such that the first and third volatile switching layers 118A and 118C are formed adjacent to the top and bottom electrodes 116 and 114, respectively.

The STT-MRAM array 100 incorporating the two-terminal bidirectional selectors 104 of the embodiments of FIGS. 5A, 6A, 8, and 9 may be used for multiply-accumulate (MAC) operations, thereby making the array 100 suitable for various neural network applications, such as deep neural networks and convolutional neural networks.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A magnetic memory cell comprising:
a magnetic tunnel junction (MTJ) including:
a magnetic free layer having a variable magnetization direction substantially perpendicular to a layer plane of the magnetic free layer;
a magnetic reference layer having an invariable magnetization direction substantially perpendicular to a layer plane of the magnetic reference layer; and
an insulating tunnel junction layer interposed between the magnetic free and reference layers; and
a two-terminal bidirectional selector electrically connected to the MTJ and including:
a bottom electrode;
a top electrode;
a load-resistance layer interposed between the bottom and top electrodes, the load-resistance layer comprising a first tantalum oxide;
a first volatile switching layer interposed between the bottom and top electrodes, the first volatile switching layer comprising a metal dopant and a second tantalum oxide that has a higher oxygen content than the first tantalum oxide; and
a second volatile switching layer in contact with the first volatile switching layer, the second volatile switching layer comprising a third tantalum oxide that has a higher oxygen content than the first tantalum oxide.

2. The magnetic memory cell of claim 1, wherein a current-voltage response of the two-terminal bidirectional selector is characterized by a hysteresis loop.

3. The magnetic memory cell of claim 1, wherein the two-terminal bidirectional selector has two distinct electrical resistances at an applied voltage.

4. The magnetic memory cell of claim 1, wherein the metal dopant is silver or copper.

5. The magnetic memory cell of claim 1, wherein the metal dopant is one of tellurium, nickel, or cobalt.

6. The magnetic memory cell of claim 1, wherein the third tantalum oxide has a stoichiometric composition.

7. The magnetic memory cell of claim 1, wherein the second tantalum oxide has a stoichiometric composition.

8. The magnetic memory cell of claim 1, wherein the bottom and top electrodes each independently comprise one of titanium nitride or iridium.

9. The magnetic memory cell of claim 1, the load-resistance layer further comprises the metal dopant.

10. The magnetic memory cell of claim 1, wherein the two-terminal bidirectional selector further includes a third volatile switching layer in contact with the second volatile switching layer opposite the first volatile switching layer, the third volatile switching layer comprising the second tantalum oxide and the metal dopant.

11. The magnetic memory cell of claim 1, wherein the two-terminal bidirectional selector further includes a third volatile switching layer in contact with the second volatile switching layer opposite the first volatile switching layer, the third volatile switching layer comprising the metal dopant and a fourth tantalum oxide that has a higher oxygen content than the first tantalum oxide.

12. A magnetic memory cell comprising:
a magnetic tunnel junction (MTJ) including:
a magnetic free layer having a variable magnetization direction substantially perpendicular to a layer plane of the magnetic free layer;
a magnetic reference layer having an invariable magnetization direction substantially perpendicular to a layer plane of the magnetic reference layer; and
an insulating tunnel junction layer interposed between the magnetic free and reference layers; and
a two-terminal bidirectional selector electrically connected to the MTJ and including:
a bottom electrode;
a top electrode;
a load-resistance layer interposed between the bottom and top electrodes, the load-resistance layer comprising a first tantalum oxide;
a first volatile switching layer interposed between the bottom and top electrodes, the first volatile switching layer comprising a metal dopant and a second tantalum oxide that has a higher oxygen content than the first tantalum oxide; and
a second volatile switching layer in contact with the first volatile switching layer, the second volatile switching layer comprising a stoichiometric or near-stoichiometric hafnium oxide.

13. The magnetic memory cell of claim 12, wherein a current-voltage response of the two-terminal bidirectional selector is characterized by a hysteresis loop.

14. The magnetic memory cell of claim 12, wherein the load-resistance layer further comprises the metal dopant.

15. The magnetic memory cell of claim 12, wherein the second tantalum oxide has a stoichiometric composition.

16. The magnetic memory cell of claim 12, wherein the metal dopant is silver or copper.

17. The magnetic memory cell of claim 12, wherein the two-terminal bidirectional selector further includes a third volatile switching layer in contact with the second volatile switching layer opposite the first volatile switching layer, the third volatile switching layer comprising the second tantalum oxide and the metal dopant.

18. A magnetic memory cell comprising:
a magnetic tunnel junction (MTJ) including:
a magnetic free layer having a variable magnetization direction substantially perpendicular to a layer plane of the magnetic free layer;
a magnetic reference layer having an invariable magnetization direction substantially perpendicular to a layer plane of the magnetic reference layer; and
an insulating tunnel junction layer interposed between the magnetic free and reference layers; and
a two-terminal bidirectional selector electrically connected to the MTJ and including:
bottom and top electrodes each independently comprising one of titanium nitride or iridium;
a load-resistance layer interposed between the bottom and top electrodes, the load-resistance layer comprising a first tantalum oxide and a metal dopant;
a first volatile switching layer interposed between the bottom and top electrodes, the first switching layer comprising the metal dopant and a second tantalum oxide that has a higher oxygen content than the first tantalum oxide;
a second volatile switching layer in contact with the first volatile switching layer, the second volatile switching layer comprising a stoichiometric tantalum oxide that has a higher oxygen content than the first tantalum oxide; and
a third volatile switching layer in contact with the second volatile switching layer opposite the first volatile switching layer, the third volatile switching layer comprising the second tantalum oxide and the metal dopant, wherein the metal dopant is silver or copper.

19. The magnetic memory cell of claim 18, wherein a current-voltage response of the two-terminal bidirectional selector is characterized by a hysteresis loop.

20. The magnetic memory cell of claim 18, wherein the second tantalum oxide has a stoichiometric composition.

* * * * *